US010222266B2

(12) United States Patent
Veprik (10) Patent No.: US 10,222,266 B2
(45) Date of Patent: Mar. 5, 2019

(54) RUGGEDIZED DEWAR UNIT FOR INTEGRATED DEWAR DETECTOR ASSEMBLY

(71) Applicant: Semi Conductor Devices—an Elbit Systems-Rafael Partnership, Haifa (IL)

(72) Inventor: Alexander Veprik, K. Motzkin (IL)

(73) Assignee: SEMI CONDUCTOR DEVICES—AN ELBIT SYSTEMS-RAFAEL PARTNERSHIP, Haifa (IL)

( * ) Notice: Subject to any disclaimer, the term of this patent is extended or adjusted under 35 U.S.C. 154(b) by 900 days.

(21) Appl. No.: 14/638,945

(22) Filed: Mar. 4, 2015

(65) Prior Publication Data
US 2015/0276488 A1  Oct. 1, 2015

(30) Foreign Application Priority Data

Mar. 27, 2014  (IL) .......................................... 231731

(51) Int. Cl.
*F25B 9/00* (2006.01)
*G01J 5/06* (2006.01)
(Continued)

(52) U.S. Cl.
CPC ............ *G01J 5/061* (2013.01); *F17C 13/006* (2013.01); *F25D 19/006* (2013.01); *G01J 5/023* (2013.01);
(Continued)

(58) Field of Classification Search
CPC ...... F25B 9/00; F25B 9/06; F25B 9/10; F25B 9/14; G01J 5/061; G01J 5/023;
(Continued)

(56) References Cited

U.S. PATENT DOCUMENTS 3,942,010 A  *  3/1976  Peterson .................... F25B 9/02
                                                 250/338.1
4,852,356 A  *  8/1989  Unger .................... F02G 1/0445
                                                 60/520
(Continued)

FOREIGN PATENT DOCUMENTS

CN        201130058        10/2008
CN        203203713         9/2013
JP        03152381 A   *   6/1991

OTHER PUBLICATIONS

European Search Report from European Application No. 15157255. 9-1562 dated Sep. 10, 2015.
(Continued)

*Primary Examiner* — Frantz Jules
*Assistant Examiner* — Erik Mendoza-Wilkenfe
(74) *Attorney, Agent, or Firm* — Dorsey & Whitney LLP (57) ABSTRACT

An Integrated Dewar Detector Assembly (IDDA) is presented. The IDDA comprises: a cold finger base; an elongated Dewar envelope having a proximal end associated with the cold finger base and a distal end comprising an optical window; an elongated tubular cold finger located inside said elongated Dewar envelope and having a proximal end at the cold finger base and a distal end for carrying a detector so as to expose the detector to incoming radiation through said optical window; an internal front support member extending from an inner surface of the Dewar envelope at its distal end to the distal end of the cold finger; and at least one wideband dynamic vibration absorber assembly located outside the Dewar envelope and attached to at least one location on an exterior surface of the Dewar envelope, said dynamic vibration absorber thereby attenuating vibration of the cold finger and the detector.

20 Claims, 8 Drawing Sheets

(51) Int. Cl.
*B01D 8/00* (2006.01)
*G01J 5/02* (2006.01)
*G12B 3/08* (2006.01)
*F16F 7/00* (2006.01)
*F16F 9/04* (2006.01)
*G01J 5/04* (2006.01)
*F17C 13/00* (2006.01)
*F25D 19/00* (2006.01)
*H01L 31/024* (2014.01)
*H02S 40/44* (2014.01)

(52) U.S. Cl.
CPC ............ *G01J 5/044* (2013.01); *H01L 31/024* (2013.01); *H02S 40/44* (2014.12); *F25B 2500/13* (2013.01)

(58) Field of Classification Search
CPC ...... B01D 8/00; G12B 3/08; F16F 7/00; F16F 7/087; F16F 7/104; F16F 1/377; F16F 1/38; F16F 9/0418; F16F 9/3235; F16F 9/3242; F16F 9/38; B60G 2204/41
USPC .................................. 248/629, 560
See application file for complete search history.

(56) References Cited

U.S. PATENT DOCUMENTS

| | | | | |
|---|---|---|---|---|
| 5,564,536 | A * | 10/1996 | Lai | F16F 1/387 188/379 |
| 5,811,816 | A | 9/1998 | Gallagher et al. | |
| 5,924,670 | A * | 7/1999 | Bailey | F16F 1/3615 188/380 |
| 6,006,875 | A * | 12/1999 | van Namen | F16F 15/03 188/378 |
| 6,131,394 | A * | 10/2000 | Lavietes | F04B 39/0027 62/55.5 |
| 6,292,967 | B1 * | 9/2001 | Tabatabai | E01D 19/16 14/22 |
| 6,588,737 | B2 * | 7/2003 | Goto | F16F 13/264 267/140.14 |
| 2010/0101903 | A1 * | 4/2010 | Boyd | F16F 1/38 188/268 |
| 2012/0079838 | A1 | 4/2012 | Bin-Nun et al. | |

OTHER PUBLICATIONS

Sinko et al., "Design and test of an adaptive vibration absorber based on magnetorheological elastomers and a hybrid electromagnet", Journal of Intelligent Material Systems and Structures, vol. 24 No. 7, May 1, 2013, pp. 803-812.

Veprik et al., "Portable cryogenically cooled infrared imager: how silent it might be?", Infrared Technology and Applications XXXIII, Proc. of SPIE vol. 6542, 65422P-1-65422P-12, (2007).

Veprik et al., "Ruggedizing infrared Integrated Dewar-Detector Assemblies for harsh environmental conditions", Infrared Technology and Applications XL, Proc. of SPIE vol. 9070 907020-1-907020-10, 2014.

Verpik et al., "Suppression of cryocooler-induced microphonics in infrared imagers", Cryogenics 49 (2009) 449-454.

Filis, et al. "Cryocoolers for infrared Missile Warning Systems", SPIE Proceedings vol. 7660, Infrared Technology and Applications XXXVI, 9 pages.

Ho, et al. "Ruggedizing printed circuit boards using a wideband dynamic absorber", Shock and Vibration, vol. 10, (2003), pp. 195-210.

Ikuta, et al. "Development of a Long-Life Stirling Cryocooler", Crycoolers 11, 2002, pp. 97-102.

Nesher, et al. "High resolution 1280×1024, 15 μm pitch compact InSb IR detector with on-chip ADC", Infrared Technology and Applications XXXV, May 7, 2009, pp. 1-9.

* cited by examiner

FIG. 1

(GENERAL ART)

FIG. 2

(GENERAL ART)

RUGGEDIZED DEWAR UNIT FOR INTEGRATED DEWAR DETECTOR ASSEMBLY

TECHNOLOGICAL FIELD

Embodiments of the invention are generally in the field of infrared (IR) imaging techniques, and relates to Integrated Dewar Detector Assemblies (IDDA), particularly useful in cooled IR imaging system requiring mechanical and optical stability under harsh environmental vibration and shock conditions.

BACKGROUND ART

References considered to be relevant as background to the presently disclosed subject matter are listed below:
1. Y. Ikuta, Y. Suzuki, K. Kanao and N. Watanabe, Development of a long-life Stirling cryocooler, Proceedings of the 11th International Cryocooler Conference, Keystone, Colo., 2000.
2. Filis A., Pundak N., Zur Y., Broyde R. and Barak M., "Cryocoolers for infrared missile warning systems", Proc. SPIE 7660, 76602L (2010).
3. Ben Nun U., Sanchez J. P. and Lei X., "Ruggedized integrated detector cooler assembly", US Patent 2012/0079838 A1 (2012)
4. Gallagher B. W., Blionas C., Nicolosi J. A. and Barbara R., "Closed cycle gas cryogenically cooled radiation detector", U.S. Pat. No. 5,811,816 A, (1998)
5. Li Ran, et al, "Annular supporting structure of inner tube thin-wall portion of micro metal dewar", China Patent CN 203203713 U (2013)
6. Nesher O., Pivnik I., Ilan E., Calalhorra Z., Koifman A., Vaserman I., Schlesinger J. O., Gazit R., Hirsh I., "High resolution 1280×1024, 15 µm pitch compact InSb IR detector with on-chip ADC", Proc. SPIE 7298, 7298 3K (2009)
7. Chen Chang, "Infrared detector cantilever Dewar soft support structure", China Patent CN201130058 Y (2007)
8. Ho V., Veprik A., Babitsky V., "Ruggedizing printed circuit boards using a wideband dynamic absorber", Shock and Vibration, 10(3), 195-210 (2001)

Acknowledgement of the above references herein is not to be inferred as meaning that these are in any way relevant to the patentability of the presently disclosed subject matter.

BACKGROUND

Infrared (IR) imagers enhance tremendously the ability to detect and track ground, sea and air targets, and also to navigate at nighttime. Their operating principle is based on that simple fact that warmer objects radiate more and cooler objects radiate less. Since their noise figure strongly depends on the operating temperature of the IR detector, a high-resolution imager requires cryogenic cooling down to cryogenic temperatures and a high level of optic stabilization.

Modern sophisticated airborne thermal imagers, which require compact design, low input power and long lifetimes, often rely on closed cycle cryogenic coolers. Stirling coolers are especially suitable for such applications. Compared to Gifford-McMahon and Joule-Thomson cycles, Stirling offers more than twice the cooling performance in the cooling power range 1-100 W. The application of new technologies allows the life-time figures for Stirling coolers to be well beyond 40000 hours [1].

Stirling coolers, which may be of both split and integral types, typically comprise two major components: a compressor and an expander. In a split cooler these are interconnected by a flexible gas transfer line (a thin-walled stainless steel tube of a small diameter) to provide for maximum flexibility in the system design and to isolate the IR detector from the vibration interference which is produced by the compressor. In the integral cooler these components are integrated in a common casing.

The reciprocating motion of a compressor piston provides the required pressure pulses and the volumetric reciprocal change of a working agent (helium, typically) in the expansion space of an expander. A displacer, reciprocating inside a cold finger, shuttles the working agent back and forth from the cold side to the warm side of the cooler. During the expansion stage of the thermodynamic cycle, heat is absorbed from the IR detector mounted upon the cold finger tip (cold side of a cycle), and during the compression stage, heat is rejected to the ambient from the cold finger base (warm side of a cycle).

It is a modern tendency to mount the IR detector directly upon the cold finger tip. Such a concept allows for practical elimination of the integration losses and better temperature uniformity across the IR sensor, as compared, for example, with the outdated slip-on design. The evident penalty is that in this approach the dynamic and optical stability of the FPA relies entirely on the stiffness of the cold finger being made of the low heat conductive thin-walled stainless steel or Titanium tube having inherently insufficient stiffness and low damping resulting entirely from the nonlinear contact phenomena occurring between the cryogenically cooled displacer tube end (typically made of reinforced Teflon) and the cold finger interior. Resulting from this is that such a cold finger supporting the infrared FPA is a slender, lightly damped, tip-mass cantilever typically responding to the environmental disturbance by developing a large dynamic response, the magnitude of which can become comparable with the pixel size and thus degrade the image quality or even cause IDDA fatigue damage due to the material overstressing.

Attempts at stiffening the cold finger by increasing its thickness or by adding some stiffening features at its warm distal end are reported in [2]. Attempts have also been reported of mechanical support to its cold distal end [3, 4, 5] extending from the evacuated Dewar envelope. In one implementation, the support member takes the form of a truncated conical metal tube with a low thermal conductivity [3] connected to the Dewar base at its proximal (warm) end and to the distal (cold) end of the cold finger. In the second implementation [4], the support member takes the form of a composite star-wise disk with low heat conductivity, the central bore of which is fitted tightly around the cold finger distal (cold) end wherein its circumstantial portion is fitted tightly inside the bore at the distal end of evacuated Dewar. In the third implementation [5], an annular supporting structure is made of Titanium and comprises an upper and lower coaxial rings and reinforced ribs connecting the said supporting rings. The upper ring is attached to the Dewar base and a lower ring is tightly clamped around the cold finger tube using suitable epoxy resin. Recently developed a technology of Dewar ruggedizing is based on using supporting strings connecting the distal end of the rugged Dewar envelope and cold finger tip. The strings are made of material with a high stiffness and low heat conductivity [6].

In another approach, the distal end of the evacuated Dewar envelope is supported from the host structure (optical bench) using a conductive soft rubber ring [7]. Since rubber ring is essentially softer than the Dewar envelope, the total stiffening and damping effects are quite minor.

General Description

There is a need in the art for ruggedizing the cryogenically cooled infrared electro-optical payloads which have to operate and survive frequent exposure to harsh vibration and shock conditions typical of the modern battlefield. The need for a ruggedization is specifically applicable for Integrated Dewar-Detector Assemblies where the infrared Focal Plane Arrays are usually supported by typically low heat conductive thin-walled metal cold fingers, the intrinsically low mechanical stiffness of which is compensated by additional low heat conductive mechanical support member extending from the evacuated Dewar envelope to the distal end of the cold finger.

The positive effect of adding mechanical stiffness results in shifting the resonant frequency to the high frequency range. However, since both evacuated Dewar envelope and support member are typically not damped at all, the resulting damping ratio of the combined system appears to be essentially lower as this of the cold finger, which is damped by nonlinear sliding and vibroimpact contact with the reciprocating displacer tube. This manifests itself in high amplifications at resonance and may result in intolerable dynamic responses and mechanical stresses in the components of the Integrated Dewar-Detector Assemblies exposed to wideband vibration profiles or sharp shocks.

As indicated above, various techniques have been developed for providing mechanical support to a cold distal end extending from the evacuated Dewar envelope [3, 4, 5]. However, the efficiency of such an approach appears to be questionable, especially in cases where the vibration profile contains enough energy over the typical high frequency range. Although the resonant frequency of the relatively rigid evacuated Dewar envelope typically falls well above the "standard" 2 kHz margin, a dynamic coupling with the FPA mounted on the cold finger tip results in a combined dynamic system showing a very sharp resonant amplification occurring well below the said 2 kHz margin. Typical is a doubling the first resonant frequency (from, say, 800 Hz to 1600 Hz) and a 4-fold decrease of the damping ratio (from, say, 2% to 0.5%). In the case of "high frequency" vibration profiles typical of airborne applications, such a supporting the cold finger tip may be useless for controlling the FPA deflection; the penalties, however, will involve extra heat loading due to parasitic conduction and higher levels of acceleration experienced by the FPA.

Simultaneous reduction of the relative deflection and absolute acceleration of the FPA is possible in the case of a very rigid Dewar envelope and a support member shifting the typical resonant frequencies well above the said 2 kHz margin. Stiffening the evacuated Dewar envelope, however, is not always feasible because of the added bulk to the electro-optical package. Along with these lines, further stiffening of the front support member leads to an elevated parasitic heat load and is not feasible in the majority of cases. Improper design of the Dewar envelope and support member can make the situation even worse.

As for the known approach based on supporting the distal end of the evacuated Dewar envelope from the host structure (optical bench) using a conductive soft rubber ring [7], this technique suffer from the cumbersome packaging.

Hence, there is a need for further ruggedizing of the Integrated Dewar-Detector Assemblies towards harsh environmental conditions involving wideband vibration profiles and sharp shocks.

Embodiments of the present invention provide a novel configuration of an Integrated Dewar Detector Assembly (IDDA). As typically, the IDDA includes a cold finger base, an evacuated Dewar envelope extending from the cold finger base, and a cold finger having a proximal end extending from said base, and a distal end carrying a Focal Plane Array (FPA). The distal end of the cold finger is mechanically supported from the distal end of the evacuated envelope by a support member.

The IDDA of embodiments of the present invention is modified for suppressing/absorbing and reducing the mechanical vibration of the cold finger module and, accordingly, of the IR FPA mounted thereon. More specifically, according to one or more embodiments of the present invention, the IDDA comprises at least one wideband dynamic vibration absorber (e.g. dynamic vibration damper) located outside the Dewar envelope and mechanically coupled to the Dewar envelope. In virtue of the mechanical support member, there exists a strong dynamic coupling between the envelope and the cold finger, so the externally mounted dynamic absorber attenuates the vibration of the cold finger. This configuration of the Dewar assembly provides improved FPA image quality and increased durability of the cold finger.

In the most general case, the wideband dynamic absorber is an auxiliary, heavily damped "mass-spring" mechanical system being mounted upon the primary resonating mechanical system. The large relative motion of the mass and the primary resonating system results in large deformation velocities of the damped spring. This, in turn, results in essential damping effect occurring mostly at the resonant frequencies of the primary mechanical system. As is known, at a given mass, there exists an optimal combination of resonant frequency and damping ratio of the dynamic absorber delivering the best attenuation of vibration response under random stationary excitation and fastest settling times under fast transient phenomena like shock.

Thus, one or more embodiments of the present invention are aimed at further ruggedizing an Integrated Dewar-Detector Assembly (IDDA) including an evacuated Dewar envelope and a cold finger with its front support member, by providing a wideband dynamic absorber damping the Dewar envelope and, through a strong dynamic coupling, the distal end of the cold finger, and, thereof, the FPA. To this end, the wideband dynamic absorber-auxiliary heavily damped sprung mass, is mounted externally to the Dewar envelope. Depending on the dynamic properties of a cold finger, Dewar envelope and a support member, an optimal combination of the spring rate, damping factor and mass of the wideband dynamic absorber minimizing the dynamic response of the FPA and settling times is provided.

According to a broad aspect of the present invention, there is provided an Integrated Dewar Detector Assembly, comprising:

a cold finger base;

an elongated Dewar envelope having a proximal end associated with the cold finger base and a distal end comprising an optical window, an elongated cold finger located inside the Dewar envelope and having a proximal end associated with said cold finger base and a distal end carrying a detector which is exposed to incoming radiation through said optical window, a front support member extending from an inner surface of the Dewar envelope at a distal portion thereof and supporting a distal portion of the cold finger; and at least one wideband dynamic vibration absorber assembly located outside the Dewar envelope and attached to at least one location on an exterior surface of the Dewar envelope, said at least one dynamic vibration absorber thereby suppressing vibration of the cold finger.

It should be understood that, practically, the cold finger may be integral with the cold finger base or may at one end thereof (proximal end) be attached by, say, brazing to the cold finger base. The Dewar envelope may also at its proximal end be attached to the cold finger base. The Dewar envelope is of a tubular-like shape and is appropriately evacuated.

In some embodiments of the invention, the wideband dynamic absorber includes a tubular inertial member made of heavy metal and a low profile viscoelastic grommet made of highly damped elastomer or wire-mesh bushing, wherein a circular tooth of the tubular member tightly fits a circular slot of the grommet, the central portion of which is squeezed between two flat washers using a nut and a threaded stud, the free end of which is attached to the Dewar envelope using a threaded mounting stud. The preferable mounting position is the distal end of the evacuated envelope. However, the wideband absorber may be mounted in any convenient and available position.

In some other possible embodiments, the wideband dynamic absorber includes a highly damped elastomer or wire mesh compliant ring or ring-like member coaxially enveloping the round portion of the Dewar envelope, and a heavy metal tubular member, coaxially enveloping the outer surface of the ring. The tubular member may have two parts forming a slot inside which the compliant ring is squeezed.

In yet further possible embodiments, the wideband dynamic absorber includes a proximal electronics box supported by a mechanical holder which is mounted upon the evacuated Dewar envelope using a highly damped elastomer or wire mesh compliant ring enveloping coaxially the round portion of the Dewar envelope.

According to another broad aspect of the invention, there is provided a Dewar assembly for use in an Integrated Dewar Detector Assembly (IDDA), the Dewar assembly comprising:

an elongated Dewar envelope having a proximal end associated with a cold finger base and a distal end comprising an optical window, an elongated cold finger located inside the Dewar envelope and having a proximal end associated with the cold finger base and a distal end configured for carrying a detector to expose the detector to incoming radiation through said optical window, a front support member extending from an inner surface of the Dewar envelope at a distal portion thereof and supporting a distal portion of the cold finger; and at least one wideband dynamic vibration absorber assembly located outside the Dewar envelope and attached to at least one location on an exterior surface of the Dewar envelope, said at least one dynamic vibration absorber thereby suppressing base-induced vibration of the cold finger and the detector during operation of the IDDA.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which.

DETAILED DESCRIPTION OF EMBODIMENTS

Figure 1:
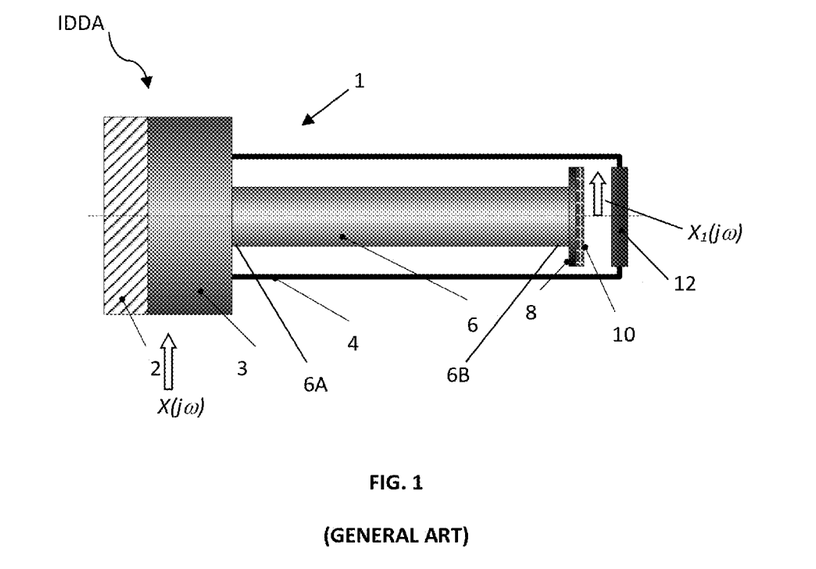
FIG. 1 is a schematic diagram of the state of the art IDDA with an unsupported cold finger.

FIG. 1 shows the schematic diagram of the state of the art IDDA 1 mounted on a mechanical interface 2. The IDDA 1 includes a tubular cold finger 6 having a proximal (warm) end 6A and a distal (cold) end 6B, and extending from a cold finger base 3 to a cold finger cup 8, where an FPA 10 is mounted. The cold finger 6 with the cup 8 and FPA 10 are located inside a tubular evacuated Dewar envelope 4 extending from the cold finger base 3 wherein high vacuum environment is provided for the cryogenically cooled portions of the IDDA. Incident radiation (infrared radiation) arrives to the FPA 10 through an infrared transparent window 12 which is mounted upon a distal end of the tubular evacuated Dewar envelope.

Figure 2:
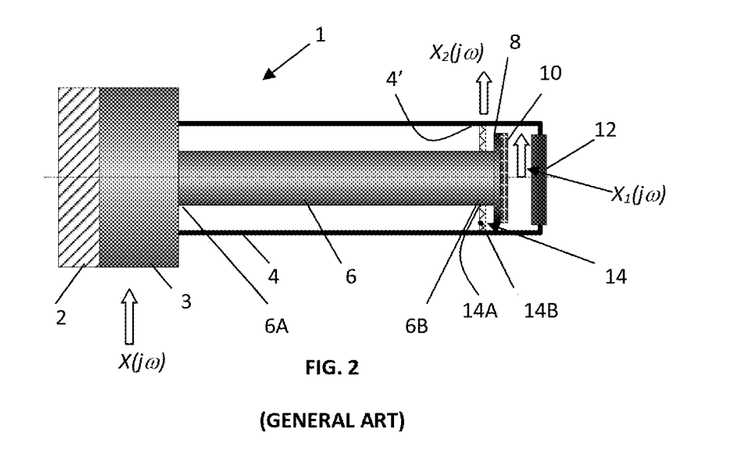
FIG. 2 is a schematic diagram of the state of the art IDDA with a supported cold finger.

FIG. 2 shows the schematic diagram of the state of the art IDDA configured generally similar to the IDDA of FIG. 1, but further including a disk-like support member 14. The latter serves as the low heat conductive front support member with purpose of additional support of the cold finger distal (cold) end 6B from the evacuated Dewar envelope 4. The support member 14 has a central hole 14A which is tightly matched and bonded to the distal (cold) end 6B of the cold finger 6, and the circumferential surface 14B coaxial with the central hole which is tightly matched and bonded to the interior surface 4' of the tubular Dewar envelope 4.

Reference is made to FIGS. 3A-3C and 4A-4C showing, for the reference, typical dynamic responses of the IDDA of FIG. 1 featuring unsupported cold finger 6 (FIGS. 3A-3C) and those of the IDDA of FIG. 2 featuring cold finger 6 supported by the support member 14, under typical random vibration test per MIL-STD 810F having uniform power spectral density (PSD) over the frequency range 10-2000 Hz, the overall level is 5 g rms.

The function $$X_0(j\omega) = \int_{-\infty}^{\infty} x_0(t)e^{-j\omega t}\,dt$$

(FIGS. 1 and 2) is the complex Fourier transform of the base vibratory motion given by the time function $x_0(t)$, where the angular frequency is w and $j=\sqrt{-1}$ is the complex unity.

Similarly, $$X_{1,2}(j,\omega) = \int_{-\infty}^{\infty} x_{1,2}(t)e^{-j\omega t}\,dt$$

are the complex Fourier transforms of the cold finger tip and Dewar envelope vibratory motion, respectively. The appropriate power spectral densities of relative displacements an absolute accelerations are denoted as $X0(\omega)$ $X1(w)$ and $X2(w)$ and $A0(\omega)$, $A1(\omega)$ and $A2(\omega)$, respectively.

In the experiments, the results of which are shown in FIGS. 3A-3C and 4A-4C, the IDDA with and without support member 14, was mounted in the fixture of vibration exciter, and accelerometers were used for monitoring the motion of the FPA 10 and Dewar envelope 4.

Figure 3A:
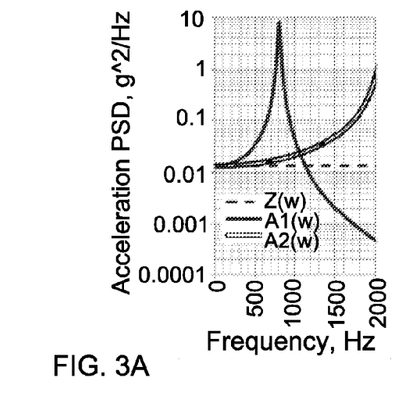
FIGS. 3A to 3C exemplify typical dynamic responses of the IDDA of FIG. 1 featuring an unsupported cold finger.

In particular, in FIG. 3A, three graphs are shown, $A0(w)$, $A1(w)$ and $A2(w)$ corresponding to acceleration PSD of, respectively, the base 3, FPA 10 and Dewar envelope 4. The dynamic response $A1(w)$ of the cold finger 6 (and thus FPA 10 fixed thereon) shows a well pronounced resonant amplification at approximately 800 Hz, while graph $A2(w)$ shows that the resonance of the Dewar envelope 4 occurs well above the 2 kHz margin.

Figure 3B:
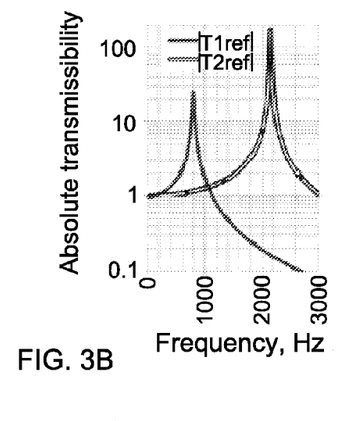

FIG. 3B shows the spectra of modules of absolute transmissibility of the FPA 10 and Dewar envelope 4, T1ref(w) and T2ref(w), respectively. The frequency range in this figure is extended to 3 kHz in order to demonstrate that the Dewar envelope resonance occurs at approximately 2100 Hz. As shown, the resonant amplification of the Dewar envelope is much higher, namely 165, as compared with 25 of the cold finger/FPA.

Figure 3C:
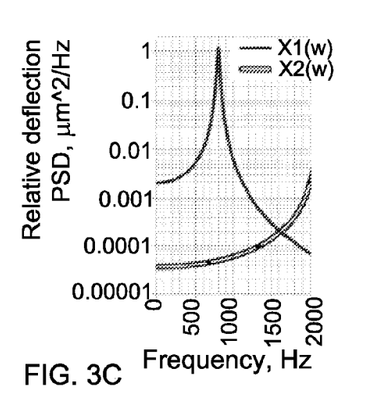

FIG. 3C shows superimposed PSD curves of relative deflection for the FPA and for the Dewar envelope, $X1(w)$ and $X2(w)$, respectively, which were evaluated indirectly using complex form of the absolute transmissibility:

$$X1(\omega) = \frac{|T1(\omega)-1|^2}{\omega^4}A(\omega).$$

It is evident from FIGS. 3A-3C that the cold finger 6 with FPA 10 and the Dewar envelope 4 behave very similarly to a single degree-of-freedom (DOF) systems having very low damping. From single DOF curve-fitting, the modal frequencies and damping ratios are respectively 800 Hz and 2% for the cold finger and 2150 Hz and 0.3% for the Dewar envelope. From the experimental test results, the overall (rms) acceleration and relative deflection levels are, respectively, 20 g rms and 7.8 µm rms for the cold finger tip, and 11 g rms and 0.6 µm rms for the Dewar envelope.

Figure 4A:
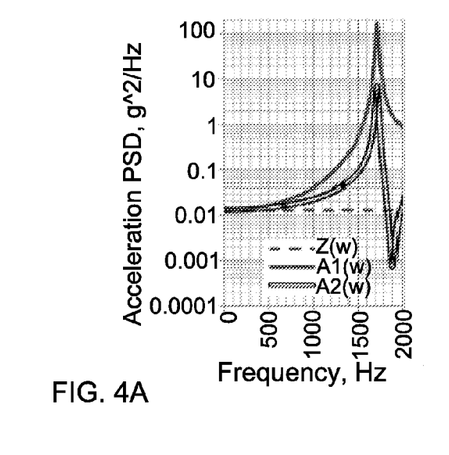
FIGS. 4A to 4C exemplify typical dynamic responses of the IDDA of FIG. 2 featuring a supported cold finger.
Figure 4B:
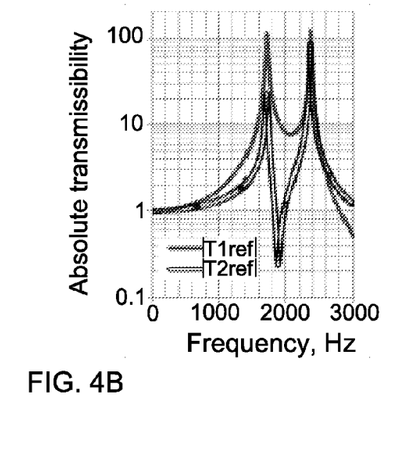
Figure 4C:
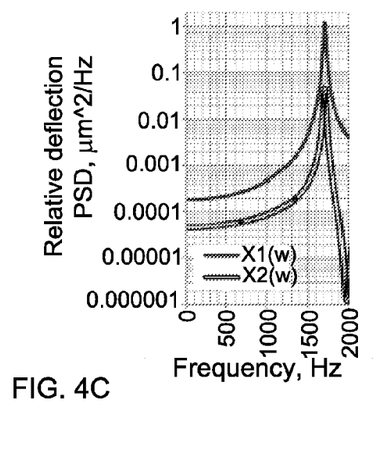

FIGS. 4A-4C show similar graphs for the IDDA of FIG. 2. More specifically, FIG. 4A shows superimposed acceleration PSDs, $A0(\omega)$, $A1(\omega)$ and $A2(\omega)$. FIG. 4B shows the superimposed moduli of absolute transmissibility for the cold finger tip and for the Dewar envelope, T1ref(w) and T2ref(w), respectively; and FIG. 4C shows superimposed PSDs of relative deflection for the FPA and the Dewar envelope, $X1(w)$ and $X2(w)$, respectively.

FIGS. 4A-4C show that the combined system of FIG. 2, formed by the cold finger 6 with FPA 10 and the front support member 14 and Dewar envelope 4, behaves as a lightly damped two DOF dynamic system. The first observed resonant frequency is essentially higher than that of the unsupported FPA, because of the added stiffness; the penalty, however, is the higher amplification at resonance. This is because adding stiffness without affecting damping results in a reduction of the effective damping ratio, which manifests itself in the form of elevated resonant amplification. The overall acceleration and relative deflection of the FPA are now 84 g rms and 7 µm rms, respectively.

Comparing FIGS. 3A-3C and FIG. 4A-4C, the resonant frequency of the combined system of FIG. 2 is still within the range of the vibration profile and the resonant amplification is extremely high, because there is insufficient stiffness and a lack of damping in the Dewar envelope and support member. The combination of these unfavorable factors results in only a minor attenuation of 12% in the relative deflection of the FPA, and a massive 4-fold amplification of the acceleration response. An additional penalty is a 40 mW increase in the Dewar heat load at 77K@23 C.

Figure 5A:
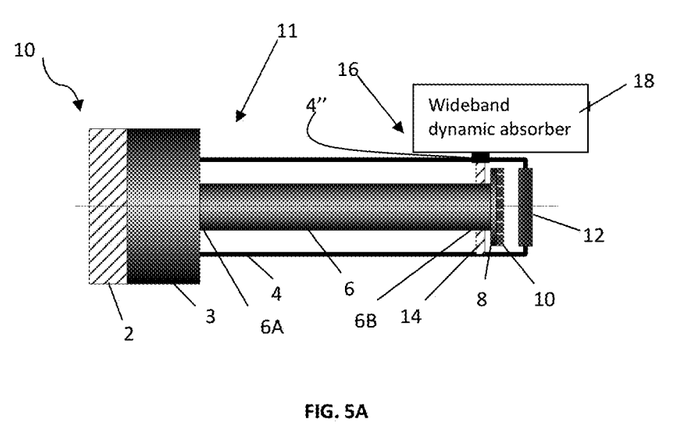
FIGS. 5A and 5B schematically illustrate an IDDA of an embodiment of the present invention, in which a wideband dynamic absorber is mounted upon the distal end of the evacuated Dewar envelope.
Figure 5B:
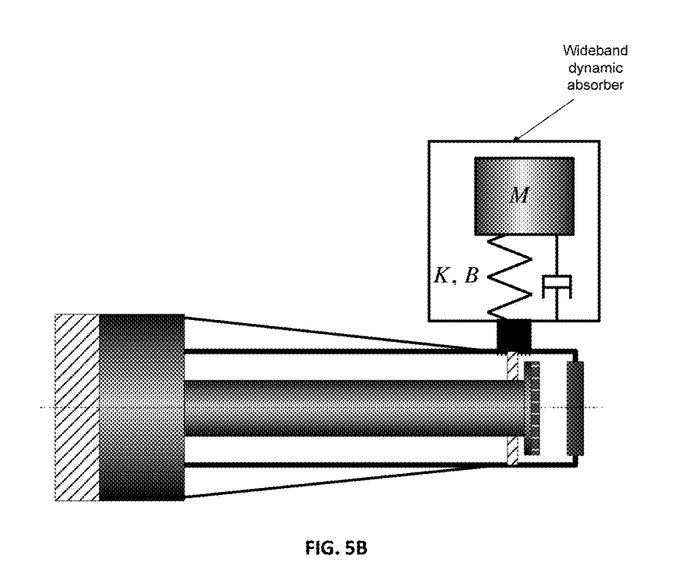

Reference is now made to FIGS. 5A and 5B illustrating an IDDA, generally designated 10, configured according to at least one embodiment of the invention. To facilitate understanding, the same reference numbers are used to identify components common in all the figures. Thus, as shown in FIG. 5A, the IDDA 10 includes a tubular evacuated Dewar 11 including a Dewar envelope 4 extending from a cold finger base 3 and ending with an infrared transparent window 12, and a tubular cold finger 6 inside the Dewar envelope 4. The cold finger also extends from the cold finger base 3, and may have a cold finger cup 8 on its distal (cold) end 6B where an FPA 10 is mounted. The cold end 6B is supported by a front support member 14 with a central hole 14A tightly matched and bonded to the cold finger 6, and a circumferential surface 14B surrounding the central hole and bonded to an inner surface 4' of the Dewar envelope 4.

According to at least one embodiment of the invention, the IDDA 10 includes a wideband dynamic absorber assembly 18 located outside the Dewar envelope 4 and coupled to an external surface 4" of the envelope 4. As illustrated in FIG. 5B, the wideband dynamic absorber assembly 18 may be represented schematically as a heavily damped single degree of freedom system having properties M, K, B (mass, spring rate and damping, respectively).

In this configuration, the support member 14 additionally serves as a mechanical coupler which couples the cold finger 6 to the Dewar envelope, and the dynamic vibration absorber assembly 18, in turn, which is coupled to the exterior of the Dewar envelope, operates to suppress vibration of the cold finger. This provides improved image quality and increased durability of the cold finger.

Figure 6A:
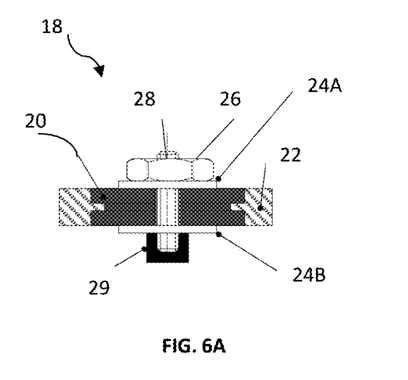
FIGS. 6A and 6B show a specific example of the support assembly of an embodiment of the present invention.
Figure 6B:
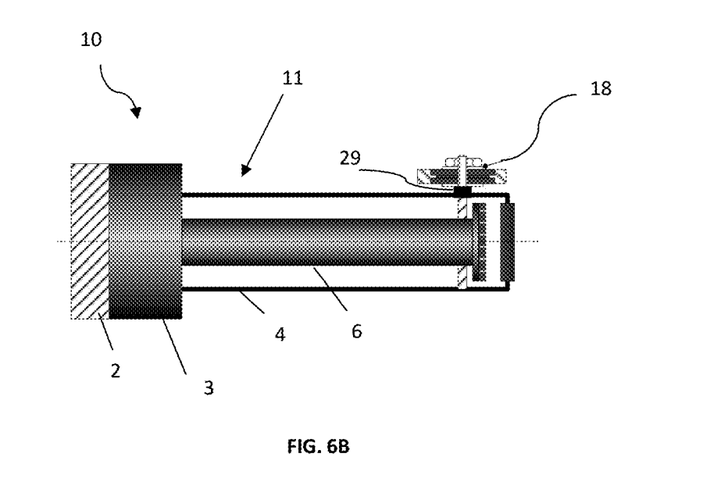

FIGS. 6A and 6B show a specific but not limiting example of the configuration of Dewar unit of at least one embodiment of the invention with the wideband dynamic absorber assembly 18 mounted on the evacuated Dewar envelope 4. In particular, the wideband dynamic absorber assembly 18 includes a low profile viscoelastic grommet 20, which is coaxially enveloped by the inertial heavy metal tubular member 22. The circular tooth feature of the tubular member 22 tightly fits a circular slot feature of the grommet 20, the central portion of which is squeezed between two flat washers 24A and 24B using a fastening assembly, which in this example is formed by a nut 26 and a threaded stud 28 protruding the central hole of the grommet 20, wherein a free end of the threaded stud 28 is attached externally to the Dewar envelope 4 using a mounting stud 29. The low profile grommet 20 is made of highly damped elastomer (like ISODAMP® or VersaDamp™ produced of E-A-R Specialty Composites) or wire-mesh (like ShockTech wire-mesh bushings) having persistent mechanical properties over the wide range of temperatures and time. FIG. 6B exemplifies the preferable mounting position of the wideband dynamic absorber assembly 18. It should however be noted that the wideband absorber 18 may be mounted in any convenient and available position. The tuning of the wideband dynamic absorber 18 is possible by varying the mass of the ring 22 and squeezing the grommet 20 resulting in changing its elastic and damping properties. After final tuning, the nut 26 is secured from loosening.

Figure 7:
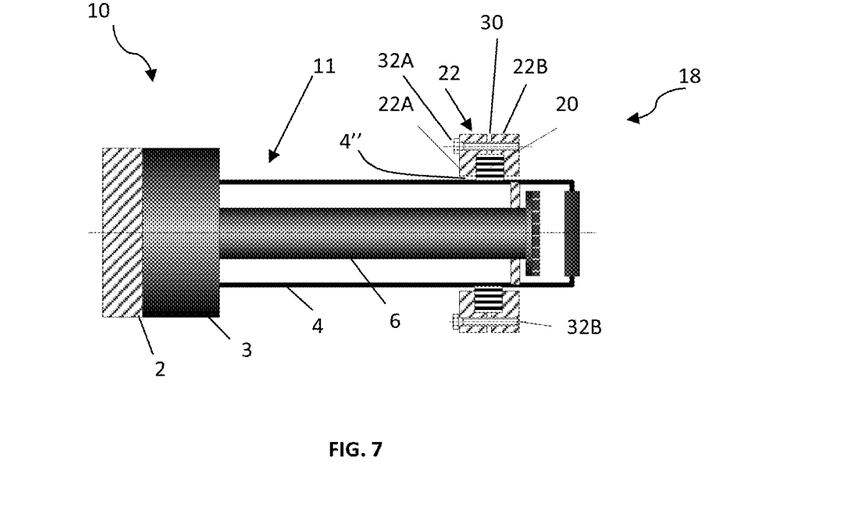
FIGS. 7 and 8 show two more possible embodiments of the configuration of the wideband dynamic absorber.

FIG. 7 shows another specific but not limiting example of the configuration of the Dewar unit of at least one embodiment of the invention. The wideband dynamic absorber assembly 18 includes a highly damped elastomer (like ISODAMP® or VersaDamp™ produced of E-A-R Specialty Composites) or wire mesh ring (like this produced by Kinetic Structures) 20 coaxially enveloping the circumferential portion of the outer surface 4" of the Dewar envelope 4, and a heavy metal tubular member (inertial ring) 22 enveloping the outer surface of the ring 20. In this example, the tubular member 22 is formed of two parts 22A and 22B configured with a slot 30 between them, inside which the compliant ring 20 is located. Tuning of the wideband dynamic absorber 18 is possible by varying the mass of the ring 20 and operating a fastening assembly, i.e. tightening screws 32A and 32B, resulting in changing the elastic and damping properties of the ring 20. After final tuning, the screws 32A and 32B are secured from loosening.

Figure 8:
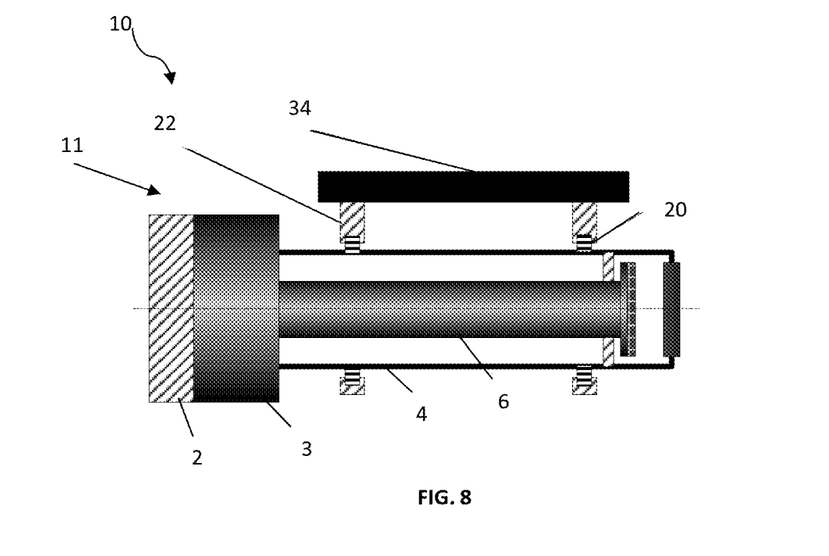

FIG. 8 illustrates yet further not limiting example of the Dewar unit 11 of at least one embodiment of the invention. In this example, the wideband dynamic absorber assembly 18 includes a proximal electronics unit 34 supported by a mechanical holder 22 which is mounted upon the outer surface 4" of the evacuated Dewar envelope 4 using the highly damped elastomer (like ISODAMP® or VersaDamp™ produced of E-A-R Specialty Composites) or wire mesh ring (like this produced by Kinetic Structures) 20 coaxially enveloping the circumferential portion of the Dewar envelope surface 4". Fine squeezing of the rings provides for optimal tuning of the wideband dynamic absorber assembly 18.

Figure 9:
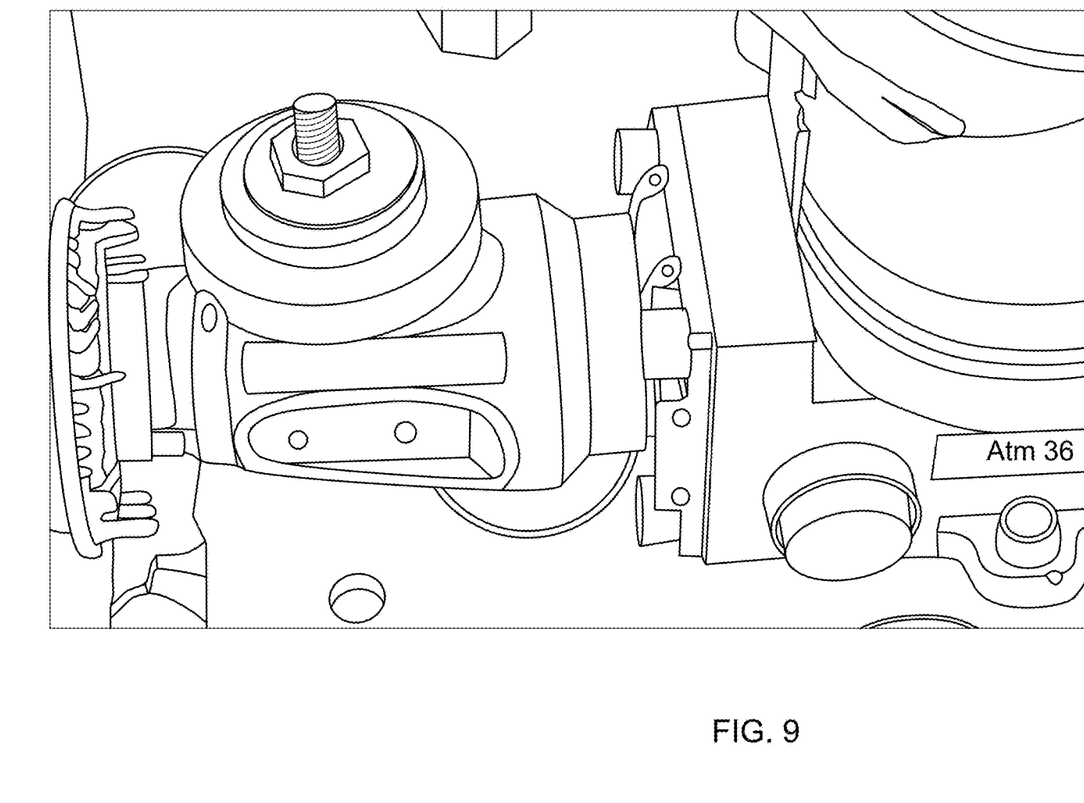
FIG. 9 illustrates an experimental setup of actual IDDA with mounted wideband dynamic absorber configured as the example of FIGS. 6A-6B.

FIG. 9 portrays the experimental setup in which the wideband dynamic absorber assembly configured according to the example of FIGS. 6A-6B is mounted upon the actual IDDA, which is mounted upon the shaker table and thus subjected to the vibration testing, using the above mentioned random vibration profile 5 g rms with uniform PSD over the frequency range 10-2000 Hz. The mass of the dynamic absorber assembly is 25 gm, the tubular member is made of Tungsten for compactness; optimized resonant frequency and damping ratio are 1600 Hz and 15%, respectively. Such a dynamic absorber adds only 2% to the weight of the entire IDDA.

The absolute displacements of the "modified" system in selected locations 1 and 2 are determined by a superposition of the base induced motion and the response to the stimulus produced by the motion of the dynamic absorber relative to the point of its attachment to the Dewar envelope, the complex Fourier transform of which looks like $(K+j\omega B)[X_2(j\omega)-X_3(j\omega)]$. Equations of motion in complex frequency domain may be written as follows:

$$X_1(j\omega)=T_1(j\omega)A_0(j\omega)-H_{21}(j\omega)(K+j\omega B)[X_2(j\omega)-X_3(j\omega)]$$

$$X_2(j\omega)=T_2(j\omega)A_0(j\omega)-H_{22}(j\omega)(K+j\omega B)[X_2(j\omega)-X_3(j\omega)]$$

$$X_3(j\omega)=T(j\omega)X_2(j\omega)$$

wherein, $T_{1,2}(j\omega)$ are the absolute complex transmissibilities of the FPA and Dewar envelope, $H_{22}(j\omega)$ is the local complex receptance of the Dewar envelope, $H_{12}(j\omega)$ is the complex receptance from the Dewar envelope to FPA and $$T(j\omega) = \frac{K + j\omega B}{-M\omega^2 + K + j\omega B}$$

is the single-mode approximation of the complex absolute transmissibility of the lumped wideband dynamic absorber expressed in terms of its mass M, spring constant K and damping factor B.

The solution to the above equation produces a set of two complex transmissibilities for the combined system $$T_2(j\omega) = \frac{X_2(j\omega)}{A_0(j\omega)} = \frac{T_2(j\omega)}{1 - M\omega^2 H_{22}(j\omega)T(j\omega)};$$

$$T_1(j\omega) = \frac{X_1(j\omega)}{A_0(j\omega)} = T_1(j\omega) + M\omega^2 H_{21}(j\omega)T(j\omega)H_{22}(j\omega)$$

Calculation of the power spectral densities and the root mean square (rms) values of the relative deflection and acceleration of the FPA in such a combined system when subjected to a vibration profile given by the acceleration PSD $A_0(\omega)$ is as follows:

$$\ddot{X}_1(\omega) = |T_1(j\omega)|^2 A_0(\omega); \ X_1(\omega) = |T_1(j\omega) - 1|^2 A(\omega)_0 \omega^{-4};$$

$$\sigma_A = \sqrt{\frac{1}{2\pi}\int_0^\infty \ddot{X}_1(\omega)d\omega}; \ \sigma_X = \sqrt{\frac{1}{2\pi}\int_0^\infty X_1(\omega)d\omega}$$

Based on the above equation for the absolute displacements, the dynamic properties of the combined system depend on those of the reference system and the properties of the dynamic absorber, M, K and B. They may be modified as to minimize the rms displacement of FPA, $\sigma_X$. The optimization procedure with M=0.025 kg yields the optimum resonant frequency $\Omega/2\pi=\frac{1}{2}\pi\sqrt{K/M}=1600$ Hz and damping ratio $\zeta=B/2M\Omega=0.15$. The calculation of the spring rate and damping factor provide: $K=M\Omega^2$; $B=2M\Omega\zeta$.

Figure 10A:
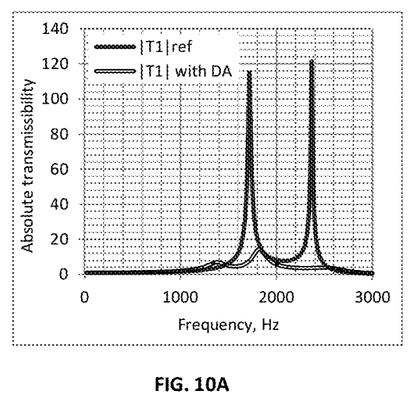
FIGS. 10A to 10F show the experimental results for the typical modification of the absolute transmissibility of the FPA as a result of mounting wideband dynamic absorber, where FIGS. 10A and 10B compare the absolute transmissibilities with and without the optimized wideband dynamic absorber mounted on the Dewar envelope, and FIGS. 10C-10D and 10E-10F compare PSD of the acceleration and relative deflection of the FPA and Dewar envelope before and after the mounting of the dynamic absorber.
Figure 10B:
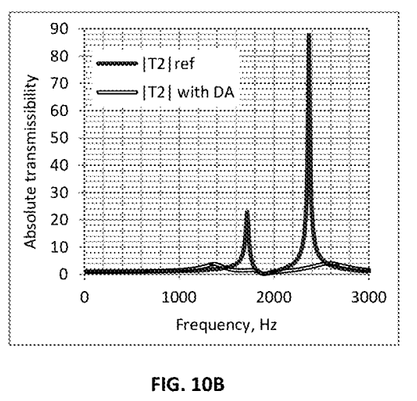
Figure 10C:
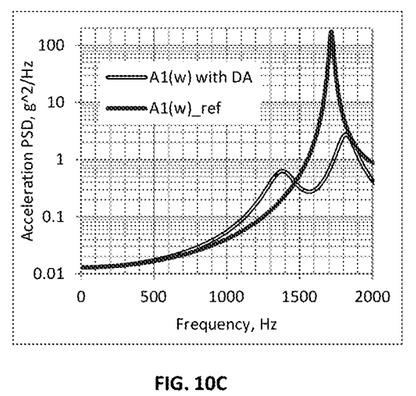
Figure 10D:
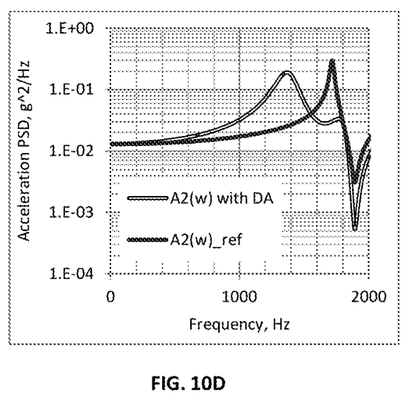
Figure 10E:
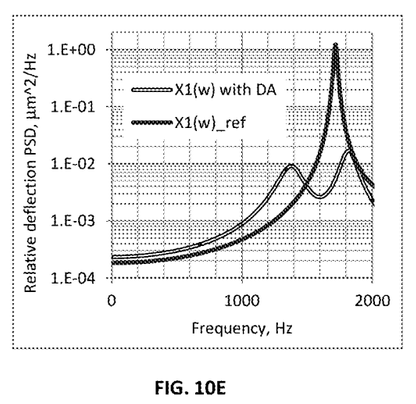
Figure 10F:
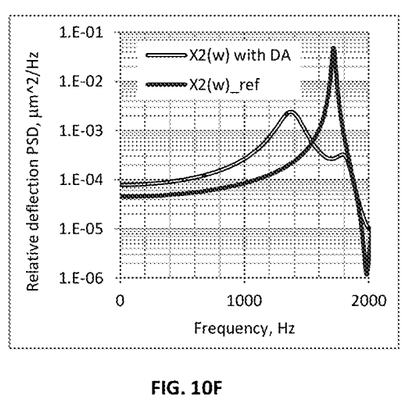

Reference is made to FIGS. 10A-10F showing graphically the experimental results, demonstrating the modifications of the dynamic responses of the Dewar envelope and FPA, as a result of mounting the wideband dynamic absorber assembly of FIGS. 6A-6B. In particular, FIGS. 10A and 10B compare the absolute transmissibilities with and without the optimized dynamic absorber mounted on the Dewar envelope. As shown in the figures, the presence of the optimally tuned dynamic absorber assembly yields massive suppression of the resonant phenomena over the entire frequency range. This results in massive attenuation of the acceleration and relative deflections. FIGS. 10C-10D and 10E-10F compare PSD of the acceleration and relative deflection of the FPA and Dewar envelope before and after the mounting of the dynamic absorber. The overall rms acceleration and deflection responses of the FPA are almost 3-fold attenuated from 86 g rms to 26 g rms and from 7.3 μm rms to 2.4 μm rms. It is noted that the acceleration response of the Dewar envelope is slightly increased from 7.4 g rms to 8.8 g rms, while the deflection rms response is slightly improved from 1.5 μm rms to 0.9 μm rms.

Figure 11A:
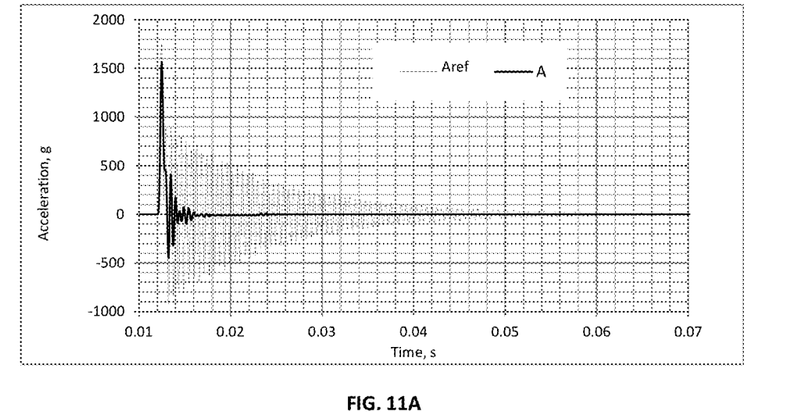
FIGS. 11A and 11B compares the typical time histories of the FPA acceleration (FIG. 11A) and relative deflection (FIG. 11B) subjected to a half-sine shock, with and without wideband dynamic absorber.
Figure 11B:
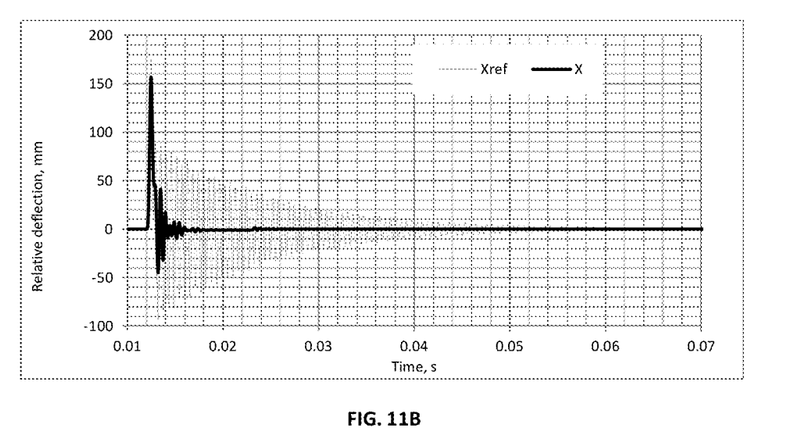

FIGS. 11A and 11B compare the time histories of acceleration (FIG. 11A) and relative deflection (FIG. 11B) of the IDDA subjected to a half-sine shock 1000 g@1 ms per MIL-STD 810F, each for the cases with and without the wideband dynamic absorber assembly of at least one embodiment of the invention. It is evident from these figures that the dynamic absorber assembly drastically improves the settling time along with relieving the dynamic stresses during the entire transient process.

While it is apparent that the illustrative embodiments of the invention disclosed herein fulfill the objectives stated above, it is appreciated that numerous modifications and other embodiments may be devised by those skilled in the art. Therefore, it will be understood that the appended claims are intended to cover all such modifications and embodiments, which would come within the spirit and scope of the present invention.

The invention claimed is:

1. An Integrated Dewar Detector Assembly (IDDA), comprising:
a cold finger base;
an elongated Dewar envelope having a proximal end associated with the cold finger base and a distal end comprising an optical window;
an elongated tubular cold finger located inside said elongated Dewar envelope and having a proximal end at the cold finger base and a distal end for carrying a detector so as to expose the detector to incoming radiation through said optical window;
an internal front support member extending from an inner surface of the elongated Dewar envelope at the distal end thereof to the distal end of the cold finger, said internal front support member being configured and operable for mechanically coupling between said cold finger and said elongated Dewar envelope; and
at least one wideband dynamic vibration absorber assembly located outside the elongated Dewar envelope and attached to at least one location on an exterior surface of the elongated Dewar envelope such that said wideband dynamic vibration absorber assembly is configured and operable to be mechanically coupled to said elongated Dewar envelope, said at least one dynamic vibration absorber assembly thereby attenuating vibration of the elongated tubular cold finger and the detector.

2. The IDDA according to claim 1, wherein the at least one wideband dynamic absorber is configured as a damped mass-spring mechanical system.

3. The IDDA according to claim 1, wherein the at least one wideband dynamic absorber includes a grommet that is fastened to a mounting stud and is attached to the exterior surface of the elongated Dewar envelope by said mounting stud, and a tubular inertial member that is attached to the grommet and coaxially envelops the grommet.

4. The IDDA according to claim 3, wherein said tubular inertial member is made of a metal material composition.

5. The IDDA according to claim 3, wherein the grommet is configured as a low profile viscoelastic element being made of a damped elastomer or a wire-mesh bushing.

6. The IDDA according to claim 4, wherein the grommet is configured as a low profile viscoelastic element being made of a damped elastomer or a wire-mesh bushing.

7. The IDDA according to claim 2, wherein the wideband dynamic absorber includes a grommet that is fastened to a mounting stud and is attached to the exterior surface of the elongated Dewar envelope by said mounting stud, and a tubular inertial member that is attached to the grommet and coaxially envelops the grommet.

8. The IDDA according to claim 7, wherein said tubular inertial member is made of a metal material composition.

9. The IDDA according to claim 8, wherein the grommet is configured as a low profile viscoelastic element being made of a damped elastomer or a wire-mesh bushing.

10. The IDDA according to claim 3, wherein the tubular inertial member has a tooth feature that tightly fits a slot feature of said grommet, and a central portion of the grommet is squeezed between two washers using a fastening assembly that is attached to said mounting stud.

11. The IDDA according to claim 4, wherein the tubular inertial member has a tooth feature that tightly fits a slot feature of said grommet, and a central portion of the grommet is squeezed between two washers using a fastening assembly that is attached to said mounting stud.

12. The IDDA according to claim 5, wherein the tubular inertial member has a tooth feature that tightly fits a slot feature of said grommet, and a central portion of the grommet is squeezed between two washers using a fastening assembly that is attached to said mounting stud.

13. The IDDA according to claim 3, wherein elastic and damping properties of the at least one wideband dynamic absorber are tunable by varying a mass of the tubular inertial member and manipulating attachment of the grommet to the mounting stud.

14. The IDDA according to claim 4, wherein elastic and damping properties of the at least one wideband dynamic absorber are tunable by varying a mass of the tubular inertial member and manipulating attachment of the grommet to the mounting stud.

15. The IDDA according to claim 5, wherein elastic and damping properties of the at least one wideband dynamic absorber are tunable by varying a mass of the tubular inertial member and manipulating attachment of the grommet to the mounting stud.

16. The IDDA according to claim 1, wherein the at least one wideband dynamic absorber includes a highly damped ring-like elastomer coaxially enveloping at least part of a circumferential portion of an outer surface of the elongated Dewar envelope, an inertial ring-like member enveloping the outer surface of said highly damped ring-like elastomer, and a fastening assembly for attaching to the outer surface of the elongated Dewar envelope.

17. The IDDA according to claim 16, wherein the inertial ring-like member is formed of two parts configured with a slot therebetween, inside which said highly damped ring-like elastomer is located.

18. The IDDA according to claim 16, wherein elastic and damping properties of the at least one wideband dynamic absorber are tunable by varying a mass of the highly damped ring-like elastomer and operating the fastening assembly.

19. The IDDA according to claim 1, wherein the at least one wideband dynamic absorber includes a proximal electronics unit supported by a mechanical holder that is mounted on an outer surface of the elongated Dewar envelope using a damped elastomer or wire mesh ring coaxially enveloping at least part of a circumferential portion of the outer surface of the elongated Dewar envelope.

20. A Dewar assembly for use in an Integrated Dewar Detector Assembly (IDDA), the Dewar assembly comprising:
- an elongated Dewar envelope having a proximal end associated with a cold finger base of the IDDA and a distal end comprising an optical window;
- an elongated cold finger located inside the elongated Dewar envelope and having a proximal end associated with the cold finger base of the IDDA and a distal end configured for carrying a detector for exposing the detector to incoming radiation through said optical window;
- a front support member extending from an inner surface of the Dewar envelope at the distal end thereof and supporting a distal portion of the cold finger; and
- at least one wideband dynamic vibration absorber assembly located outside the elongated Dewar envelope and attached to at least one location on an exterior surface of the elongated Dewar envelope, said at least one dynamic vibration absorber thereby suppressing vibration of the elongated cold finger and the associated detector.

* * * * *